Aug. 26, 1969 A. ROVELL 3,463,935

CIRCUIT FOR LIMITING CURRENT TO INTEGRATED CIRCUITS

Filed Aug. 22, 1966

INVENTOR.
ALEXANDER ROVELL

BY Robert G. Rogers

ATTORNEY

United States Patent Office 3,463,935

Patented Aug. 26, 1969

3,463,935
CIRCUIT FOR LIMITING CURRENT TO INTEGRATED CIRCUITS

Alexander Rovell, Downey, Calif., assignor to North American Rockwell Corporation Filed Aug. 22, 1966, Ser. No. 574,223
Int. Cl. H02h 7/20
U.S. Cl. 307—202 6 Claims

ABSTRACT OF THE DISCLOSURE

The circuit includes signal actuated switching means which disconnects a filter capacitor from a voltage reference level during periods of circuit operation when the filter capacitor functions as a power source for supplying excessive currents to an integrated circuit. The switch also provides a minimum impedance during normal circuit operations so that the filtering action of the capacitor is not hampered.

This invention relates to a circuit for limiting excessive currents to integrated circuits and, more particularly, to such a circuit for limiting the current by interrupting the flow of current to an integrated circuit during periods when the integrated circuit is attempting to draw excessive currents.

Integrated circuits have a tendency to draw excessive currents from power sources and therefore impair their operating characteristics when exposed to hostile environments such as excessive radiation, heat, etc. The power sources include power supplies normally supplying current to the integrated circuits as well as filter capacitors which appear to be power supplies under conditions described above. The filter capacitors are ordinarily connected to a reference level such as ground between the power supplies and the integrated circuits. Under normal operating conditions, the capacitor filters transients, and noise signals from the conductors connected to the integrated circuits.

It would be desirable to be able to disconnect the filter capacitors from the reference level during the periods in which excessive currents are being drawn. If a switch is used it must have characteristics such that under ordinary conditions current is freely conducted through the switch in either direction. Otherwise, the filtering action of the capacitors may be impaired. The switch must have a very low impedance so that filtering action is as complete as possible.

In addition, since a short duration of current could easily damage the integrated circuit, the capacitor must be disconnected from the reference as quickly as possible. Therefore, if a switch is used it must respond quickly to an actuating signal. Also, when the switch is actuated to disconnect the capacitors from the reference, it must be able to withstand the voltage across the capacitors to the reference and obviously must be able to prevent current flow through the capacitors when it is disconnected.

Briefly, the invention comprises circuit means embodying the requirements described above for limiting excessive currents to integrated circuits during conditions when the integrated circuits attempt to draw such currents. The circuit comprises switching means actuated by a signal for disconnecting the filter capacitor means from a voltage reference level during periods when the capacitor functions as a power source for supplying excessive currents to integrated circuits and for providing a minimum impedance during normal operation for not interfering with the filtering action of the capacitor.

Therefore, it is an object of this invention to provide circuit means for limiting excessive currents to integrated circuits under operating conditions when the integrated circuit would draw excessive currents.

It is a further object of this invention to provide circuit means for interrupting the flow of current to integrated circuits during periods when the integrated circuit is attempting to draw excessive currents.

Another object of the invention is to provide signal actuated switching means for disabling power sources supplying excessive currents to integrated circuits when the integrated circuits attempt to draw excessive amounts of current.

A still further object of the invention is to provide means for protecting the integrated circuits from excessive currents under abnormal operating conditions which cause the integrated circuits to draw excessive currents which could impair their operability.

These and other objects of this invention will become more apparent in connection with the following drawings of which, FIGURE 1 represents a schematic drawing of one embodiment of the invention.

Figure 1:
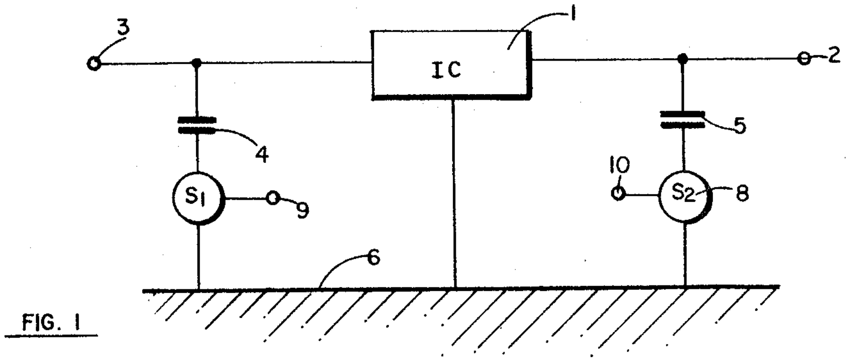

Referring now to FIGURE 1 wherein is shown a representation of an integrated circuit 1 having inputs 2 and 3 connected to receive power from sources designated as +V1 and −V2. Filter capacitors 4 and 5 are connected between the sources and the integrated circuit (IC) to filter out undesirable signals such as noise signals.

The capacitors and the integrated circuit are connected to voltage reference level 6. The reference level may be a positive or negative voltage or in the usual embodiment, ground, or zero voltage, level.

Switches 7 and 8 are connected between the capacitors and the reference level so that upon receipt of an actuating signal from a source (not shown) the switches open and prevent current from flowing through the capacitors into the IC. For example, if the IC is exposed to excessive radiation it tends to draw more current than it can stand without impairing its function. Under those circumstances, the filter capacitors function as power sources. If the current into the integrated circuit is not limited it could damage or destroy the integrated circuit. A sensor such as a radiation detector (not shown) may be placed in the proximity of the integrated circuit to be protected so that when the radiation reaches a certain maximum level, a signal is generated to actuate the switches and disable the filter capacitors as power sources. At the same time, the power sources +V1 and −V2 may be disabled by either opening their output line or by returning these levels to the reference level 6.

The switches are selected so that under normal operating conditions they conduct freely in both directions and have a minimum on-impedance for not impairing the filtering capability of the capacitors. One example of a device which can be used as a switch to disable the capacitors from ground is a germanium bi-lateral transistor of the NPN and PNP type. The PNP type could be used as switch 7, because of the positive voltage at input 3. The NPN type could be used as switch 8, because of the negative voltage at input 2.

Figure 2:
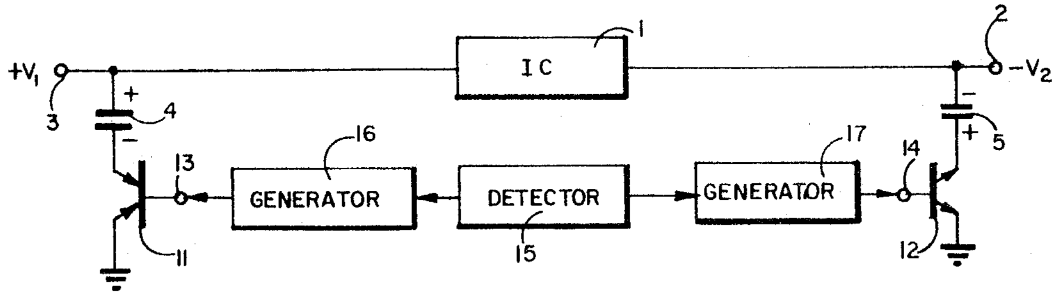
FIGURE 2 represents a specific embodiment of a circuit for limiting current to an integrated circuit.

A specific embodiment of the switches connected in the circuit between the capacitors and a ground reference level is shown in FIGURE 2. A reference level of ground is selected and transistors 11 and 12, having inputs 13 and 14, are used to exemplify switches 7 and 8. Transistor 11 may be a PNP germanium bi-lateral transistor and transistor 12 may be an NPN germanium bi-lateral transistor.

Detector 15 such as a radiation detector, is connected for sensing excessive radiation impinging on the integrated circuit. When an excessive level has been detected, the detector triggers generators 16 and 17 for generating actuating signals to inputs 13 and 14 respectively of the switching transistors.

Under conditions when the radiation level is exceeded, the integrated circuit instantaneously begins to draw current in excess of what is required for normal operation. Current is drawn from power supplies +V1, −V2 and from the filter capacitors.

However, when the radiation reaches the level which would cause the integrated circuits to draw excessive currents, the switches are actuated by the signals from generators 16 and 17 and are opened to disconnect the capacitors from ground. At the same time, supplies +V1 and −V2 are either opened or grounded. The switches, in effect, open the circuit between the capacitor and ground and prevent current flow through the capacitor.

As soon as the radiation level has dropped, the supply voltages are restored, the actuating signal is turned off and the switches again become, in effect, short circuits between the capacitors and ground so that there is no interference with the capacitors as filters. The transistors conduct in either direction to accommodate the fluctuating nature of the signals to be filtered.

Figure 3:
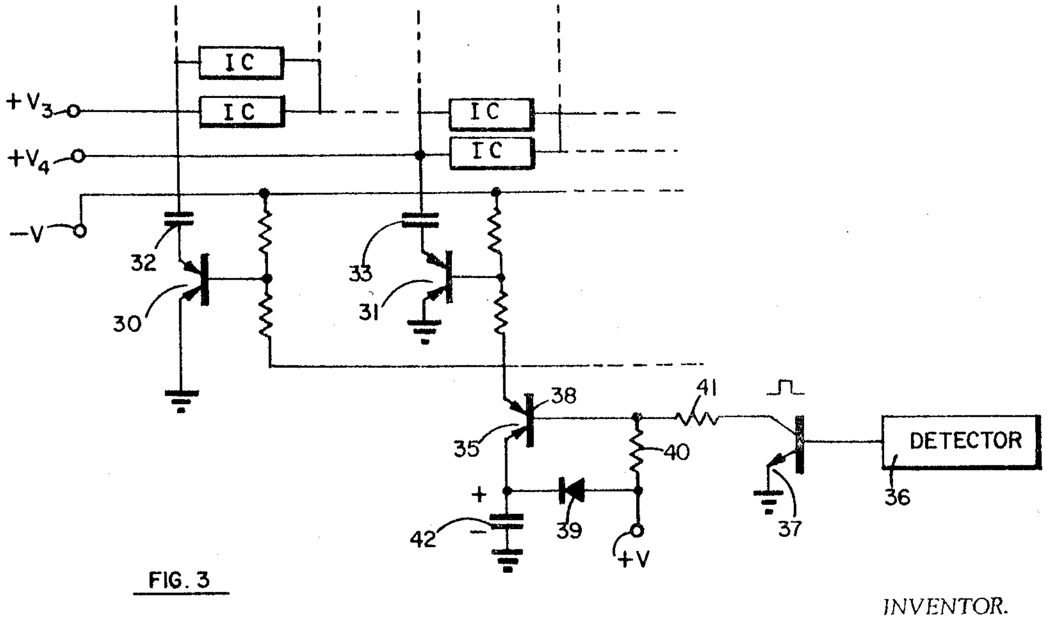
FIGURE 3 is a representation of one embodiment of the invention, including signal generating circuitry for actuating the switching means used in limiting current to integrated circuits.

Even though only one integrated circuit is shown connected in FIGURES 1 and 2, a particular capacitor and switching combination may be used to limit current to several integrated circuits as shown in FIGURE 3.

The FIGURE 3 embodiment illustrates switches 30 and 31 for protecting different integrated circuits from current supplied by capacitors 32 and 33 under abnormal operating conditions.

The FIGURE 3 embodiment also illustrates one embodiment of generator 35 for generating actuating signals for controlling the switches. Upon receipt of a trigger input from detector 36 when the environmental conditions reach a certain level, transistor 37 turns on and develops a signal across resistor 41. Transistor 38 is biased by +V in conjunction with diode 39, resistor 40 and capacitor 42 and cuts on in response to the signal across resistor 41. The voltage across capacitor 42, which is positive, causes transistors 30 and 31 to be turned off and thereby isolates capacitors 33 and 34 from ground.

It should be pointed out that even though no means for disconnecting or grounding power supplies +V3 and +V4 are shown, in a specific embodiment switches may be inserted within these supplies in order to disconnect the supplies from the integrated circuit or to ground them during periods when the integrated circuit is attempting to draw excessive currents.

It should also be understood that the various voltage levels, +V3, +V4, and +V are not necessarily identical, although in specific embodiments, they may be.

Although the invention has been described and illustrated in detail, it is to be understood that the same is by way of illustration and example only, and is not to be taken by way of limitation; the spirit and scope of this invention being limited only by the terms of the appended claims.

I claim:

1. In combination, integated circuit means having input means,
- filter capacitor means for supplying power to said integrated circuit means,
- switch means connected to said capacitor means for disabling said capacitor means from supplying excessive current to said integrated circuit means, said switch means being responsive to abnormal operating conditions.

2. The combintaion as recited in claim 1, wherein said switch means has a low impedance for not interfering with the filtering capability of said capacitor means during normal operating conditions.

3. In combination, integrated circuit means having input means,
- filter capacitor means for supplying power to said integrated circuit means,
- switch means connected to said capacitor means for disabling said capacitor means from supplying excessive current to said integrated circuit means, said switch means being responsive to abnormal operating conditions, said switch means comprises a relatively low impedance bi-lateral transistor means, and
- detector means for detecting at least one environmental condition of said integrated circuit means and for generating a signal to cut said transistor off whenever said environmental condition causes said integrated circuit means to tend to draw excessive current.

4. In combination, integrated circuit means having terminals and including means inherently associated with said circuit means which causes said integrated circuit means to draw excesive currents upon exposure to radiation in excess of a maximum level,
- capacitor mean for shunting noise signals from the terminals of said integrated circuit means to a reference level during normal operating conditions and for supplying at least part of the excessive current to said integrated circuit means when the radiation exceeds said maximum level,
- switch means connected between said capacitor means and said integrated circuit for interrupting current to said integrated circuit means.

5. The combination as recited in claim 4 wherein said switch means includes means actuated by a signal to turn the switch means off when the radiation reaches a maximum level.

6. The combination as recited in claim 4 wherein said integrated circuits means comprising a plurality of integrated circuits.

References Cited

UNITED STATES PATENTS

| | | | |
|---|---|---|---|
| 3,060,267 | 10/1962 | Feder | 307—253 X |
| 3,150,232 | 9/1964 | Schmidt | 333—76 X |
| 3,329,910 | 7/1967 | Moses | 307—255 X |
| 3,348,157 | 10/1967 | Sullivan et al. | 328—166 X |

DONALD D. FORRER, Primary Examiner

U.S. Cl. X.R.

307—241, 249, 296, 303